United States Patent
Chen et al.

(10) Patent No.: US 9,691,640 B2
(45) Date of Patent: Jun. 27, 2017

(54) MECHANISMS FOR CLEANING LOAD PORTS OF SEMICONDUCTOR PROCESS TOOLS

(71) Applicant: Taiwan Semiconductor Manufacturing Co., Ltd, Hsin-Chu (TW)

(72) Inventors: Ching-Fa Chen, Zhudong Township, Hsinchu County (TW); Hung-Wen Chen, Hsin-Chu (TW); Mei-Wei Wu, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 814 days.

(21) Appl. No.: 14/023,741

(22) Filed: Sep. 11, 2013

(65) Prior Publication Data

US 2015/0068554 A1 Mar. 12, 2015

(51) Int. Cl.
*H01L 21/67* (2006.01)
*H01L 21/677* (2006.01)

(52) U.S. Cl.
CPC .. *H01L 21/67028* (2013.01); *H01L 21/67046* (2013.01); *H01L 21/67733* (2013.01); *H01L 21/67772* (2013.01)

(58) Field of Classification Search
CPC ................ A47L 5/38; H01L 21/67028; H01L 21/67046; H01L 21/67733; H01L 21/67772; D01H 11/005; B23Q 11/0046; B08B 15/002
See application file for complete search history.

(56) References Cited

U.S. PATENT DOCUMENTS

| | | | |
|---|---|---|---|
| 6,055,694 A * | 5/2000 | Steere | H01L 21/6704 15/21.1 |
| 7,628,574 B2 | 12/2009 | Pak et al. | |
| 8,844,092 B2 | 9/2014 | Morimoto et al. | |
| 2003/0048081 A1* | 3/2003 | Seemann | B62D 55/00 318/68 |

(Continued)

FOREIGN PATENT DOCUMENTS

| | | |
|---|---|---|
| CN | 102941201 | 2/2013 |
| JP | 2003-168727 | 6/2003 |

(Continued)

OTHER PUBLICATIONS

Chinese language office action dated Aug. 24, 2015, issued in application No. TW 103115770.

*Primary Examiner* — Robert Scruggs
(74) *Attorney, Agent, or Firm* — McClure, Qualey & Rodack, LLP

(57) ABSTRACT

Embodiments of mechanisms for cleaning load ports of semiconductor process tools are provided. The automatic system includes a vacuum cleaner, a rail, and a transport mechanism. The transport mechanism is moveably disposed on the rail and transfers the vacuum cleaner along the rail. The automatic system also includes a system controller. The system controller is connected to the semiconductor process tools and the transport mechanism to detect which load port is unoccupied, such that the system controller controls the transport mechanism to transfer the vacuum cleaner to the unoccupied load port to perform a cleaning process.

20 Claims, 9 Drawing Sheets

(56) References Cited

U.S. PATENT DOCUMENTS

| | | | | |
|---|---|---|---|---|
| 2008/0282494 A1* | 11/2008 | Won | ............... | A47L 5/30 |
| | | | | 15/319 |
| 2011/0258807 A1 | 10/2011 | Guo | | |
| 2012/0125363 A1* | 5/2012 | Kim | ............... | A47L 9/28 |
| | | | | 134/6 |

FOREIGN PATENT DOCUMENTS

| | | |
|---|---|---|
| KR | 10-2008-0072238 | 8/2008 |
| TW | 201136674 | 11/2011 |
| TW | 201249557 | 12/2012 |

\* cited by examiner

MECHANISMS FOR CLEANING LOAD PORTS OF SEMICONDUCTOR PROCESS TOOLS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs, and similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As the sizes of semiconductor integrated circuits and the design rule for line widths have decreased, the issue of contamination of the devices and substrates (or wafers) during processing has become more important. The demand for extremely clean processing environments for these devices and substrates has increased.

BRIEF DESCRIPTION OF THE DRAWINGS

For a more complete understanding of the embodiments, and the advantages thereof, reference is now made to the following descriptions taken in conjunction with the accompany drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1A:
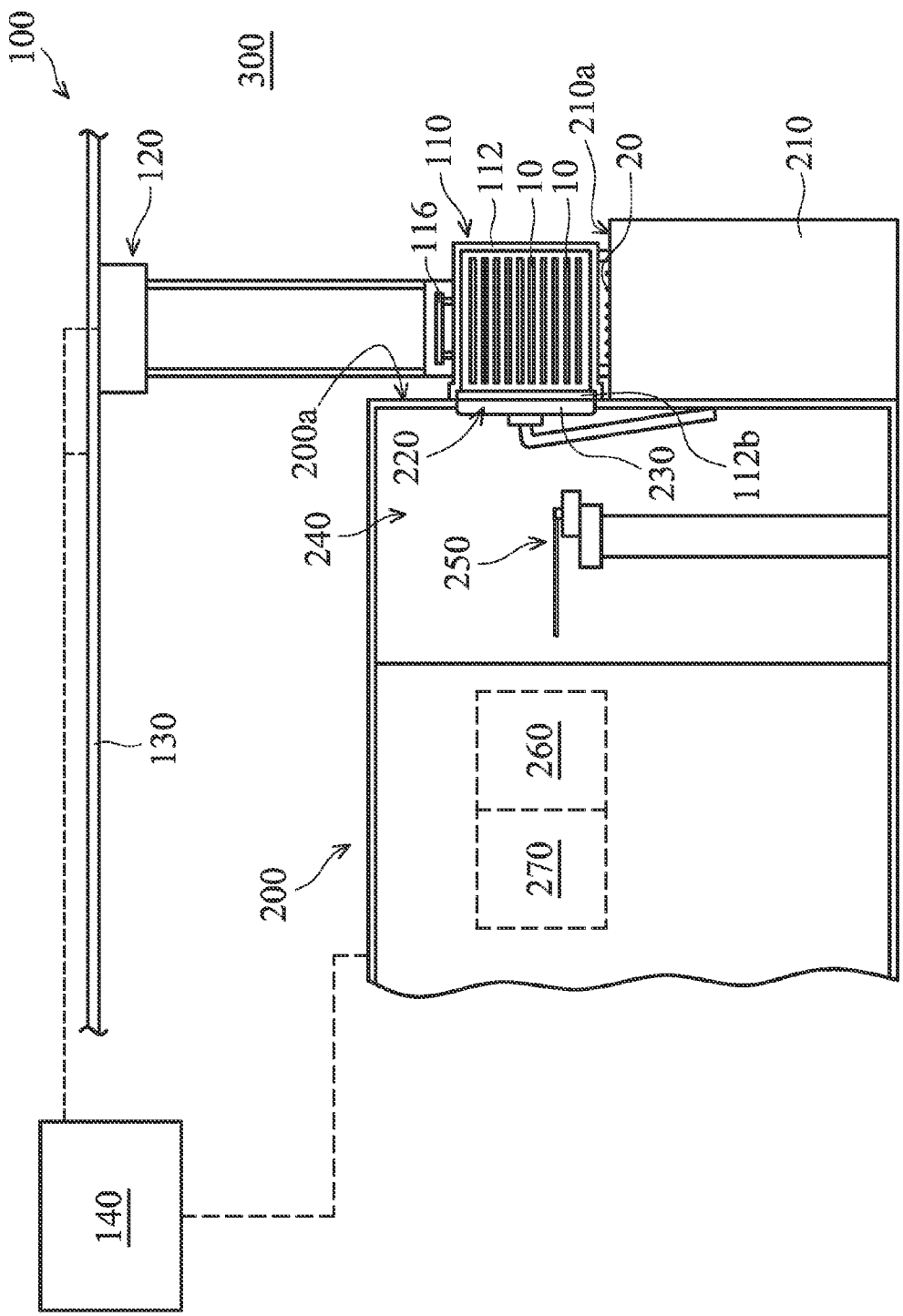
FIGS. 1A and 1B are schematic views of an automatic system and a semiconductor process tool, in accordance with some embodiments.
Figure 1B:
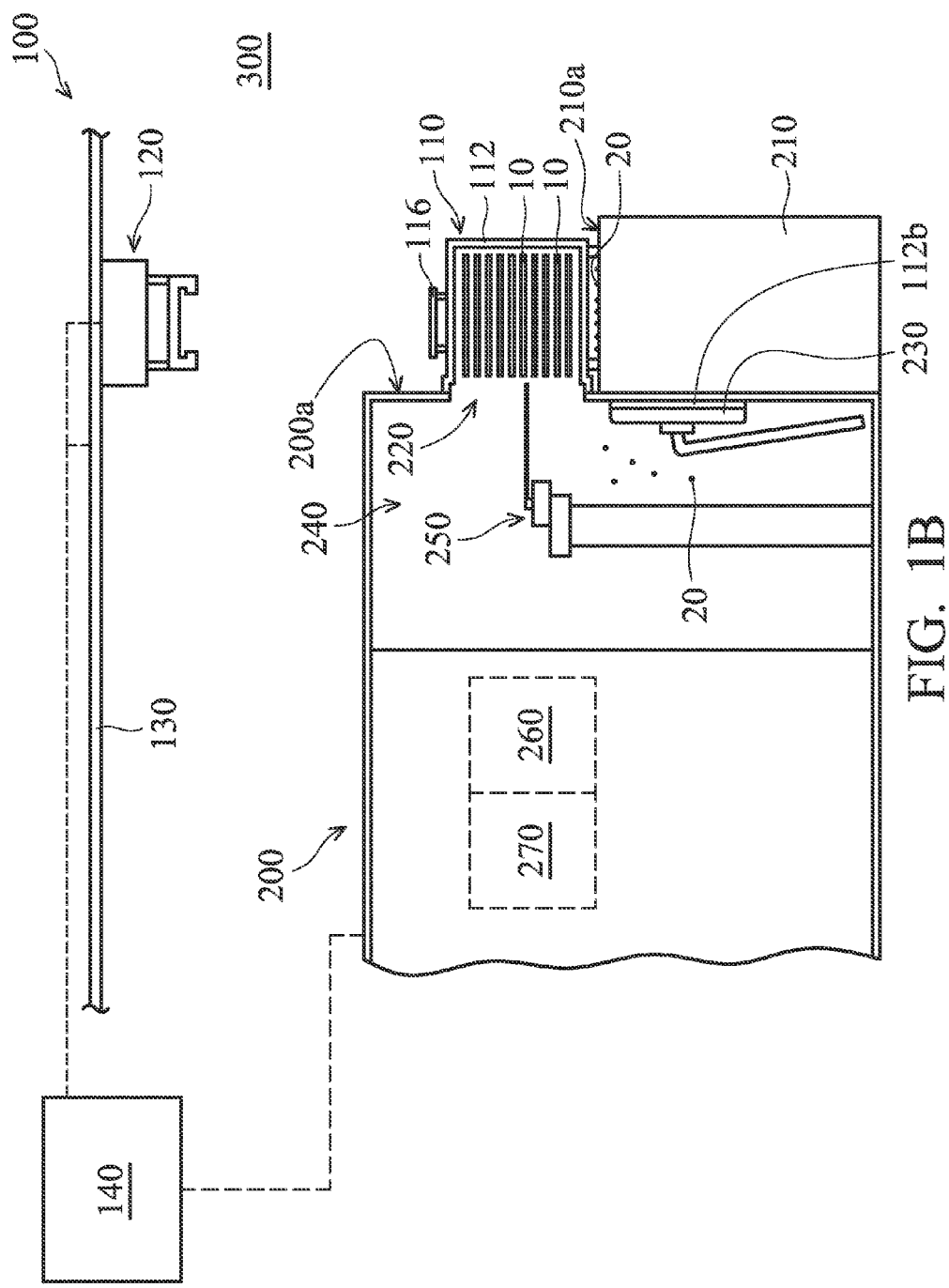

FIGS. 1A and 1B are schematic views of an automatic system 100 and a semiconductor process tool 200, in accordance with some embodiments. It should be noted that there may be a number of semiconductor process tools 200, but for the sake of simplicity, FIGS. 1A and 1B merely show one of the semiconductor process tool 200.

As shown in FIG. 1A, the automatic system 100 includes wafer carriers 110, a transport mechanism 120, a rail 130 and a system controller 140, in accordance with some embodiments. For the sake of simplicity, FIGS. 1A and 1B merely show one of the wafer carriers 110, and the wafer carrier 110 is illustrated as follows. The other carriers 110 not shown may have the same structure as the wafer carrier 110 shown in FIGS. 1A and 1B.

The wafer carrier 110 is configured to carry a number of wafers 10. The wafer carrier 110 includes, for example, a front opening unified pod (FOUP). The wafer carrier 110 may include different FOUP sizes such as 130 millimeter (mm) or 450 mm. Other types and/or sizes of the wafer carrier 110 may be used.

Figure 2:
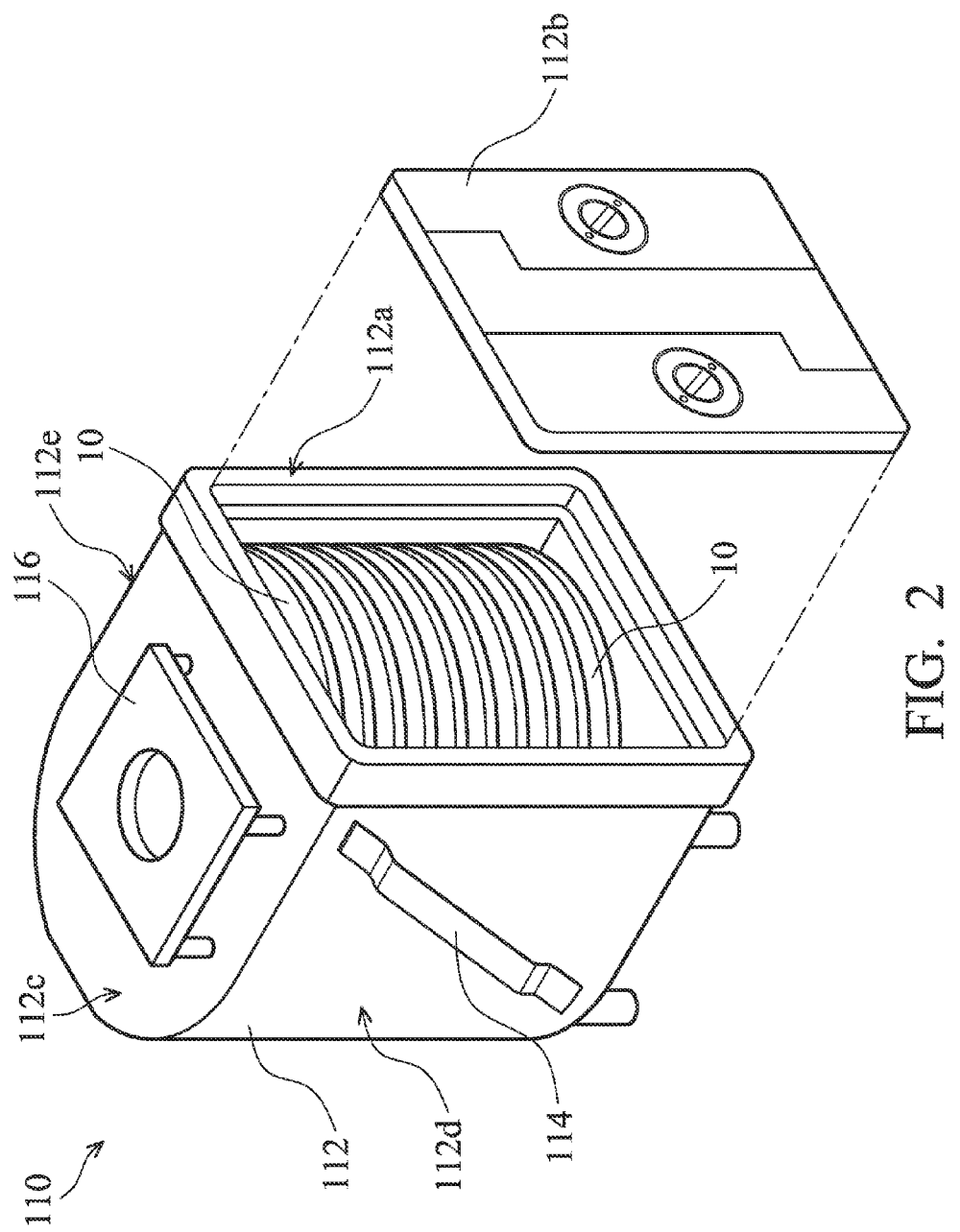
FIG. 2 is a perspective view of the wafer carrier of FIG. 1A, in accordance with some embodiments.

FIG. 2 is a perspective view of the wafer carrier 110 of FIG. 1A, in accordance with some embodiments. As shown in FIGS. 1A and 2, the wafer carrier 110 includes a housing 112, handle grips 114, and a robotic flange (or a knob) 116, in accordance with some embodiments. The housing 112 may be a box-type housing including an open front side 112a and a door 112b.

The door 112b is detachably installed at the front side 112a of the housing 112, in accordance with some embodiments. Specifically, the door 112b may be installed at the front side 112a by a locking structure (not shown). The door 112b may be separated from the housing 112 when the locking structure is released by a door opener.

The handle grips 114 are attached to opposite sides 112d and 112e of the housing 112 to facilitate carrying the wafer carrier 110. Because of the view angle of FIG. 2, the handle grip 114 attached to the side 112e is not shown. The robotic flange 116 is installed on a top surface 112c of the housing 112 so that the transport mechanism 120 can lift up the wafer carrier 110 by, for example, grasping the robotic flange 116.

The transport mechanism 120 may be moveably disposed on the rail 130. The transport mechanism 120 may grasp the robotic flange 116 and move along the rail 130 to transfer the wafer carrier 110 to (or away from) the semiconductor process tool 200. The transport mechanism 120 includes, for example, an overhead hoist transfer (OHT) system. The transport mechanism 120 may also be referred as a wafer carrier transport mechanism.

The transport mechanism 120 is designed to perform a transportation controlled by the system controller 140. The system controller 140 is connected to the semiconductor process tools 200 and the transport mechanism 120 and/or the rail 130, in accordance with some embodiments. The system controller 140 controls the transport mechanism 120 to grasp the wafer carrier 110 and move to a desired position.

The system controller 140 may receive signals from the semiconductor process tools 200. According to the signals, the system controller 140 controls the transport mechanism 120 to transfer the wafer carrier 110 with the wafers 10 therein to the semiconductor process tool 200 requiring the wafers 10. The system controller 140 may include a computer integrated manufacturing system (CIM system).

The semiconductor process tool 200 is used for semiconductor fabrication. For example, the semiconductor process tool 200 includes, a deposition tool, an electroplating tool, an etch tool, a thermal furnaces, a developing tool, etc. The semiconductor process tool 200 has a load port 210, a gate 220, a door opener 230, a front chamber 240, a transfer robot 250, a load-lock chamber 260, and a process chamber 270, in accordance with some embodiments.

The load port 210 is equipped at a front side 200a of the semiconductor process tool 200 to be loaded with the wafer carrier 110. The gate 220 is formed at the front side 200a and is above the load port 210. The gate 220 is between the front chamber 240 and the exterior clean room 300 where the wafer carrier 110 is transferred. The gate 220 is closed by the door opener 230 in the front chamber 240.

As shown in FIG. 1A, the wafer carrier 110 may be loaded on the load port 210 by the transport mechanism 120. In the meantime, the door 112b of the wafer carrier 110 may face the gate 220.

As shown in FIG. 1B, the door opener 230 opens the door 112b of the wafer carrier 110 and moves downwardly with the door 112b, in accordance with some embodiments. Accordingly, the wafer carrier 110 is opened, and the wafers 10 are loaded into the semiconductor process tool 200. The gates 220, as well as the front chamber 240, are isolated from the exterior clean room 300 by the housing 112 of the wafer carrier 110.

The cleanness of the front chamber 240 should be kept high (e.g. class 100). The transfer robot 250 is disposed in the front chamber 240. The transfer robot 250 is configured to load the wafers 10 in the wafer carrier 110 into a load-lock chamber 260 or to unload the wafers 10 from the load-lock chamber 260 into the wafer carrier 110. The process chamber 270 is disposed at a rear portion of the load-lock chamber 260. The wafers 10 may be transferred from the load-lock chamber 260 to the process chamber 270 to be processed.

As shown in FIGS. 1A and 1B, contaminants (e.g. dust or particles) 20 in the exterior clean room 300 may be deposited on a top surface 210a of the load port 210. When the wafer carrier 110 is opened, the contaminants 20 may float into the front chamber 240 and contaminate the front chamber 240 and the wafers 10.

In some embodiments, to solve this problem, the contaminants 20 are cleaned manually. However, the staffs need to walk in the exterior clean room 300 to find out which of the load ports 210 are not occupied by the wafer carriers 110. The manual cleaning method takes a lot of time and there may be some load ports 210 missed being cleaned. Therefore, it is desired to find alternative mechanisms for timely cleaning the load port.

Figure 3A:
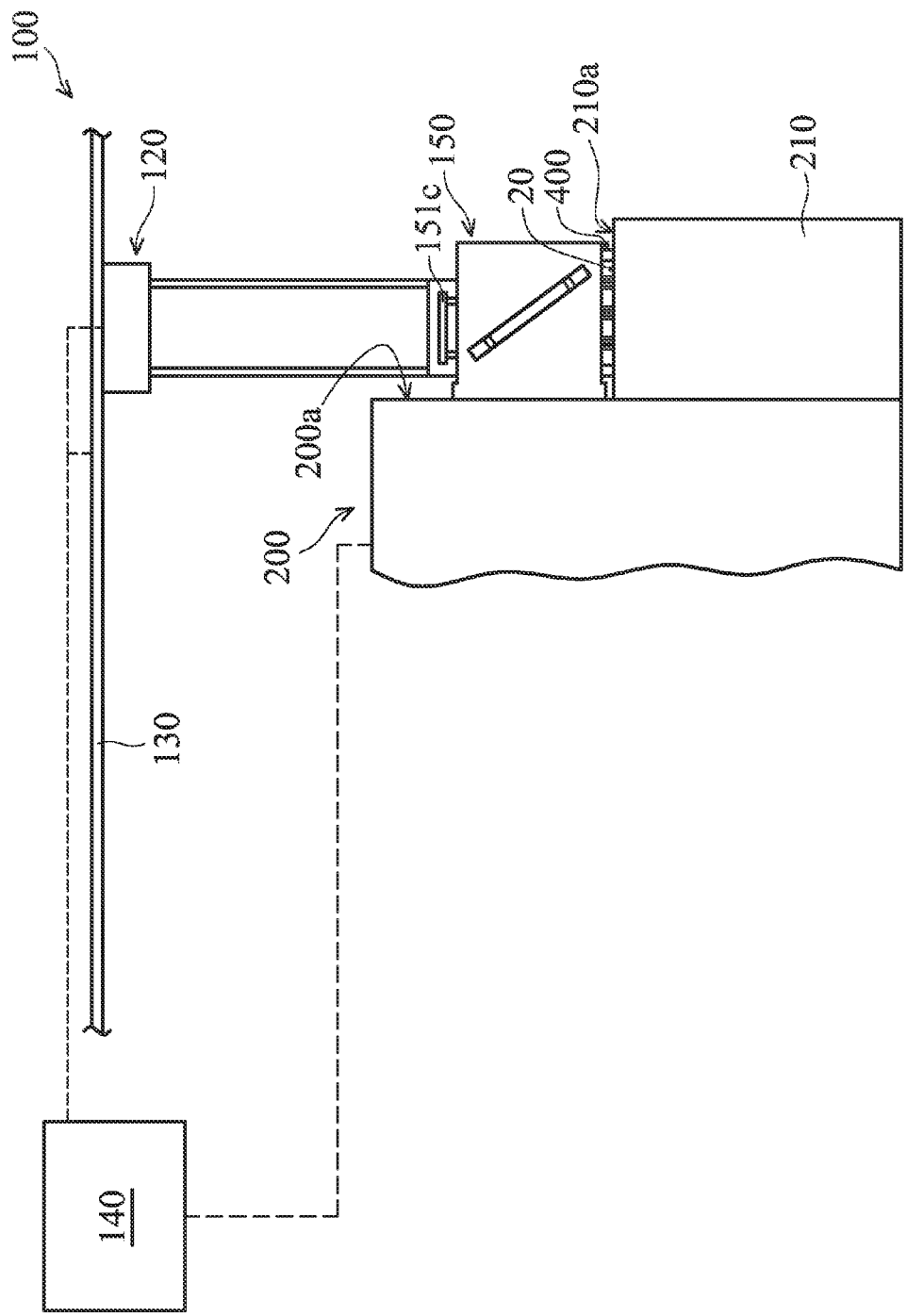
FIGS. 3A-3B are side views of an automatic system and a semiconductor process tool, in accordance with some embodiments.
Figure 3B:
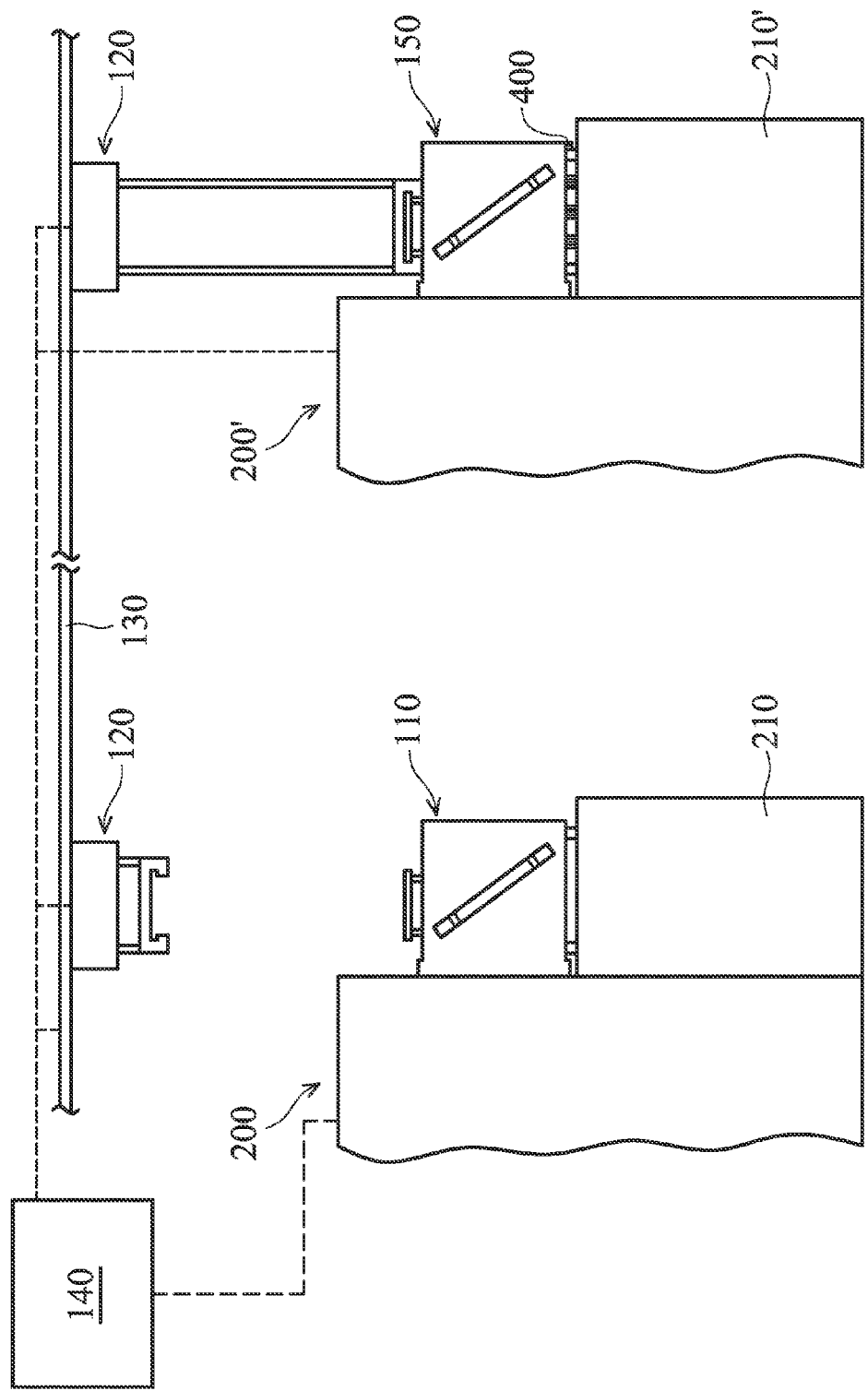

FIG. 3A is a side view of the automatic system 100 and the semiconductor process tool 200, in accordance with some embodiments. FIG. 3B is a side view of the automatic system 100 and the semiconductor process tools 200 and 200', in accordance with some embodiments.

As shown in FIG. 3A, the automatic system 100 may further include a vacuum cleaner 150. In some embodiments, before the wafer carrier 110 is loaded on the load port 210, the transport mechanism 120 transfers the vacuum cleaner 150 onto the top surface 210a of the load port 210 to clean the top surface 210a. The contaminants 20 on the load port 210 may be sucked into the vacuum cleaner 150.

Figure 4A:
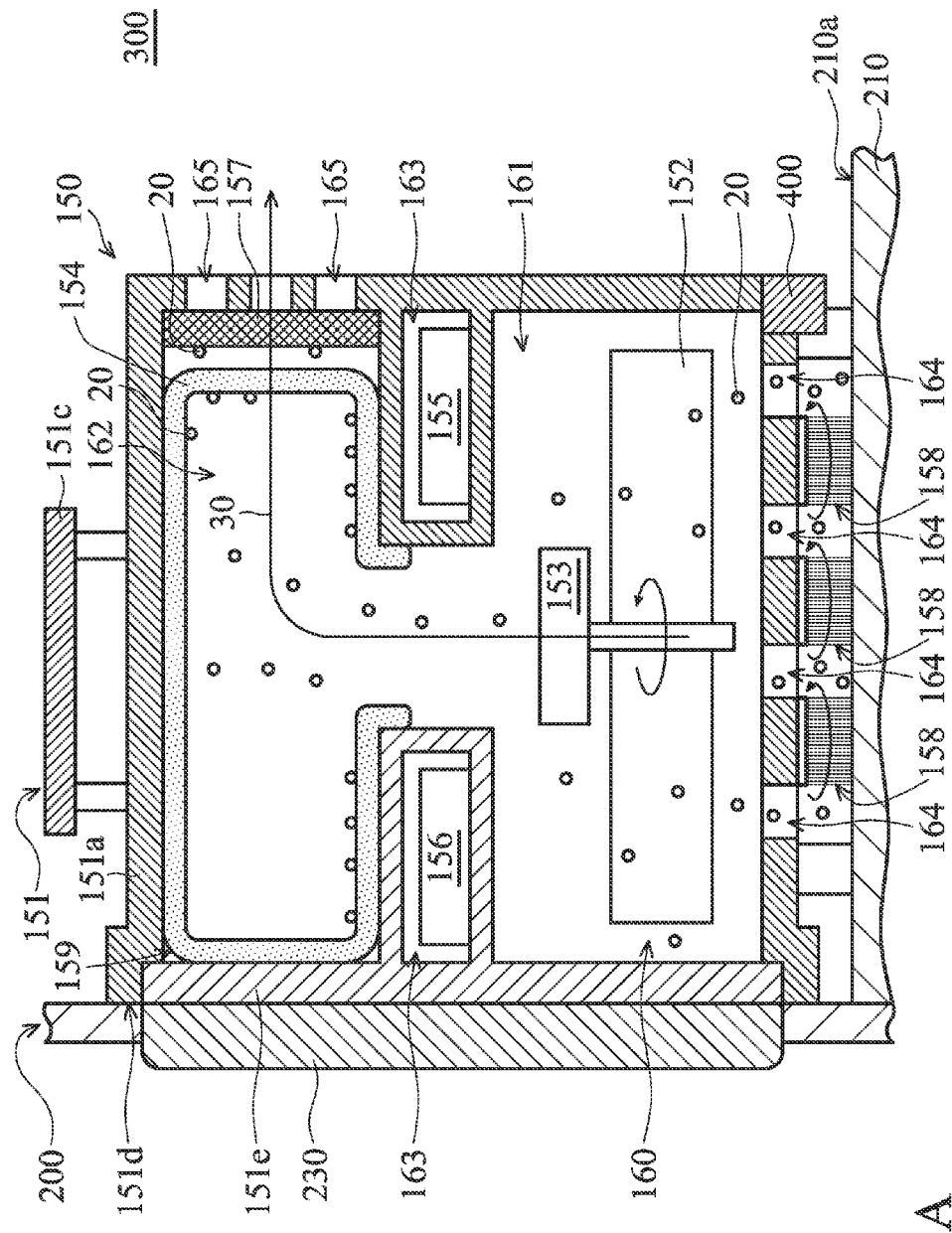
FIG. 4A is a cross-sectional view of a vacuum cleaner and a portion of a semiconductor process tool, in accordance with some embodiments.
Figure 4C:
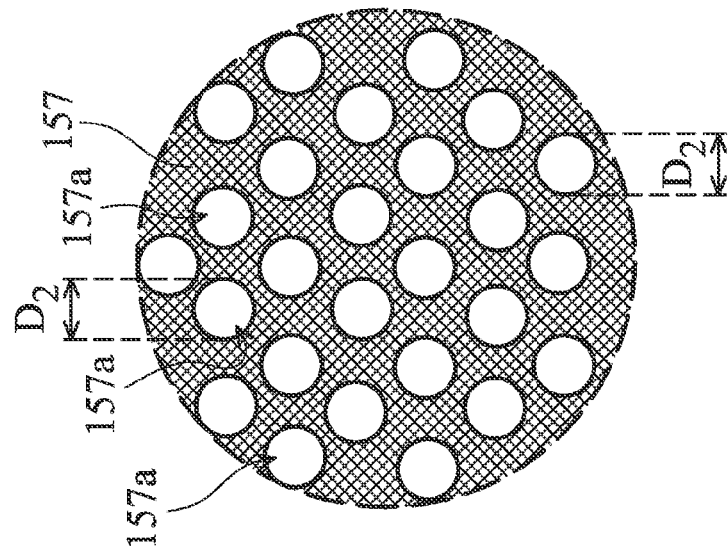
FIG. 4C is an enlarged view of a portion of a filter of the vacuum cleaner of FIG. 4A, in accordance with some embodiments.
Figure 4B:
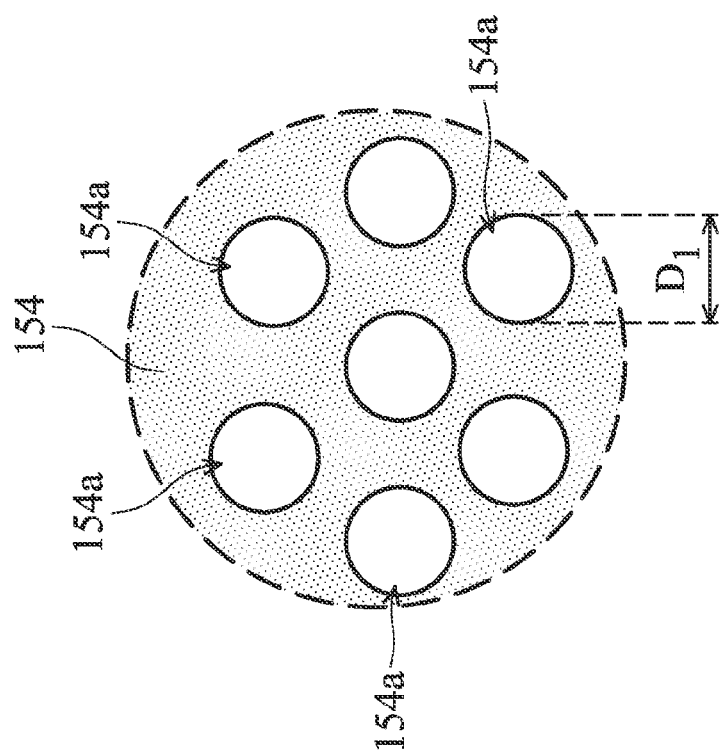
FIG. 4B is an enlarged view of a portion of a dust bag of the vacuum cleaner of FIG. 4A, in accordance with some embodiments.
Figure 5:
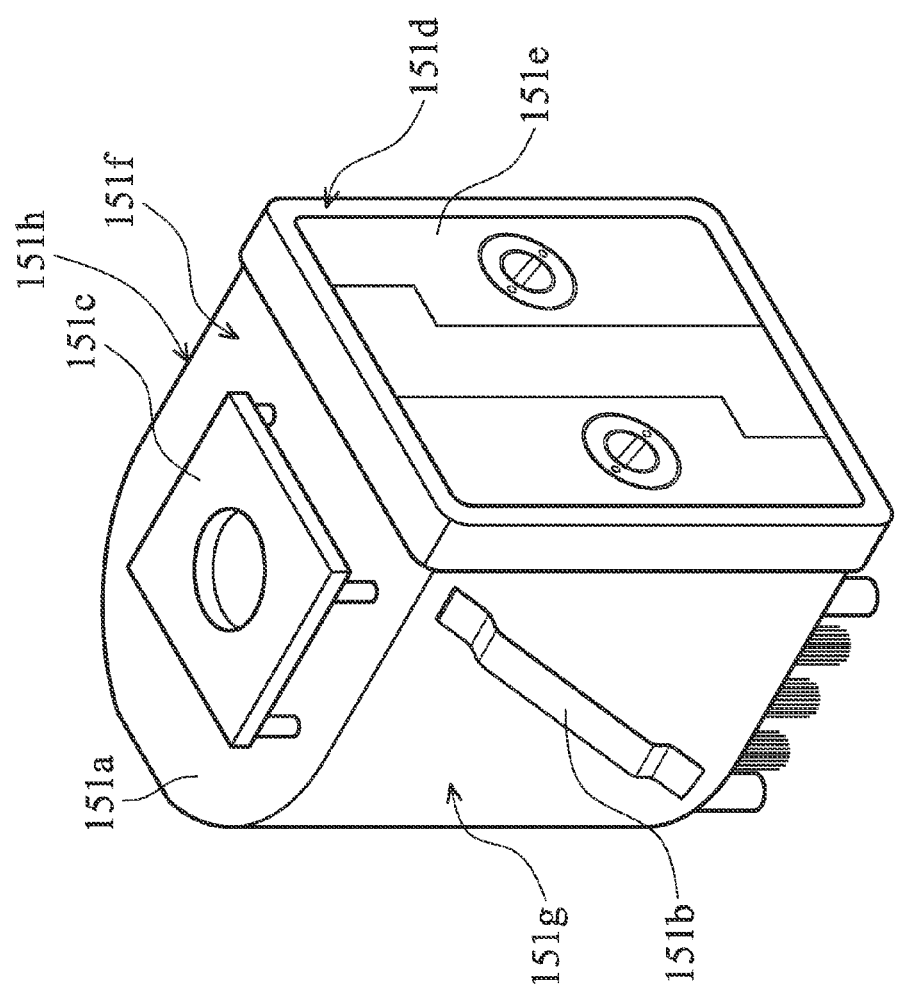
FIG. 5 is a perspective view of a vacuum cleaner, in accordance with some embodiments.

FIG. 4A is a cross-sectional view of the vacuum cleaner 150 and a portion of the semiconductor process tool 200, in accordance with some embodiments. FIG. 4B is an enlarged view of a portion of a dust bag of the vacuum cleaner 150 of FIG. 4A, in accordance with some embodiments. FIG. 4C is an enlarged view of a portion of a filter of the vacuum cleaner 150 of FIG. 4A, in accordance with some embodiments. FIG. 5 is a perspective view of the vacuum cleaner 150, in accordance with some embodiments.

As shown in FIGS. 4A and 5, the vacuum cleaner 150 includes a cleaner carrier 151 and an inner apparatus 159 in the cleaner carrier 151, in accordance with some embodiments. The cleaner carrier 151 has a similar structure as that of the wafer carrier 110 (as shown in FIG. 2). In some embodiments, external appearances of the cleaner carrier 151 and the wafer carrier 110 are substantially the same.

The cleaner carrier 151 includes a cleaner housing 151a, cleaner handle grips 151b, and a cleaner robotic flange 151c, in accordance with some embodiments. The cleaner housing 151a, the cleaner handle grips 151b, and the cleaner robotic flange 151c are similar to the housing 112, the handle grips 114, and the robotic flange 116 of the wafer carrier 110 (as shown in FIG. 2), respectively.

The cleaner housing 151a may be a box-type housing including an open front side 151d and a door 151e. The door 151e is detachably installed at the front side 151d of the cleaner housing 151a. The door 151e may be opened to clean the contaminants 20 sucked in the cleaner housing 151a.

The handle grips 151b are attached to opposite sides 151g and 151h of the cleaner housing 151a to facilitate carrying the vacuum cleaner 150. Because of the view angle of FIG. 5, the handle grip 151b attached to the side 151h is not shown. The robotic flange 151c is installed on a top surface 151f of the cleaner housing 151a. Therefore, the transport mechanism 120 can lift up the vacuum cleaner 150 by, for example, grasping the robotic flange 151c (as shown in FIG. 3A). The transport mechanism 120 may grasp the robotic flange 151c and move along the rail 130 to transfer the vacuum cleaner 150 to (or away from) the semiconductor process tool 200.

Although the cleaner housing 151a is similar to the housing 112 of the wafer carrier 110 (as shown in FIG. 2), there are still some differences between the cleaner housing 151a and the housing 112. The cleaner housing 151a has an inner space 160 including a first chamber 161, a second chamber 162 and a third chamber 163. The second chamber 162 is above and connected with the first chamber 161. The third chamber 163 is located between and isolated from the first chamber 161 and the second chamber 162.

The cleaner housing 151a has a number of suction openings 164 and exhaust vents 165, in accordance with some embodiments. The suction openings 164 penetrate through the bottom of the cleaner housing 151a to connect the first chamber 161 to the exterior clean room 300. The exhaust vents 165 penetrate through the rear portion of the cleaner housing 151a to connect the second chamber 162 to the exterior clean room 300.

The inner apparatus 159 is located in the inner space 160 for sucking, filtering out and collecting contaminants 20 on the load port 210. The inner apparatus 159 includes a suction fan 152, a motor 153, a dust bag 154, a control unit 155, a battery 156, and a sensor 400, in accordance with some embodiments.

The suction fan 152 may be located in the first chamber 161 and on the suction openings 164. The suction fan 152 is configured to generate a suction force toward the second chamber 162. The motor 153 is connected with the suction fan 152 to provide a rotational force to the suction fan 152. In some embodiments, the motor 153 is located in the first chamber 161.

The dust bag 154 is detachably installed in the second chamber 162 and on an air flow path 30 to filter out and collect the contaminants 20 sucked in by the suction fan 152. The door 151e may be opened, such that the dust bag 154 may be detached from the cleaner housing 151a to be cleaned. In some other embodiments, the dust bag 154 is replaced by a new dust bag. As shown in FIG. 4B, in some embodiments, the dust bag 154 has a number of pores 154a each having a diameter D1 less than or equal to 0.3 µm to filter out particles with a diameter larger than 0.3 µm.

As shown in FIG. 4A, the vacuum cleaner 150 further includes a filter 157, in accordance with some embodiments. The filter 157 is disposed between the dust bag 154 and the rear portion of the cleaner housing 151a to cover the exhaust vents 165. The filter 157 may filter out the contaminants 20 in the air penetrating through the dust bag 154. As shown in FIG. 4C, in some embodiments, the filter 157 has a number of pores 157a each having a diameter D2 less than or equal to 0.2 µm to filter out particles with a diameter larger than 0.2 µm. In some embodiments, the diameter D2 of the pores 157a of the filter 157 is smaller than the diameter D1 of the pores 154a of the dust bag 154.

As shown in FIG. 4A, the sensor 400 is installed on the bottom of the cleaner housing 151a to detect the distance between the cleaner housing 151a and the load port 210, in accordance with some embodiments. The control unit 155 is disposed in the third chamber 163 to control various operations of the vacuum cleaner 150.

The control unit 155 may receive a start signal from the sensor 400 when the distance between the cleaner housing 151a and the load port 210 is less than a predetermined distance. Therefore, the control unit 155 receiving the start signal may start the cleaning operation. The control unit 155 may receive a stop signal from the sensor 400 when the distance between the cleaner housing 151a and the load port 210 is larger than the predetermined distance. Therefore, the control unit 155 receiving the stop signal may stop the cleaning operation.

The predetermined distance ranges, for example, from about 15 cm to about 30 cm. In some embodiments, the predetermined distance is 30 cm. In some embodiments, the predetermined distance is 15 cm. The predetermined distance may be adjusted according to requirements.

The battery 156 may be disposed in the third chamber 163 to supply power for operating the vacuum cleaner 150. In some embodiments, the battery 156 is a rechargeable battery.

In some embodiments, the vacuum cleaner 150 further includes a number of brushes 158. The brushes 158 may be rotatably mounted on the bottom of the cleaner housing 151a. The brushes 158 are configured to brush the top surface 210a of the load port 210 so as to facilitate sucking up the contaminants 20. The brushes 158 may horizontally rotate. The brushes 158 are located between (or adjacent to) the suction openings 164, in accordance with some embodiments.

The cleaning operation (or the cleaning process) of the vacuum cleaner 150 according to some embodiments will be described as follows.

When the control unit 155 receives the start signal from the sensor 400, the control unit 155 controls the motor 153 to provide a rotational force to the suction fan 152. Therefore, a suction force is generated in the first chamber 161 and the second chamber 162 by the suction fan 152.

Afterwards, by the suction force, the contaminants 20 are sucked into the second chamber 162 through the first chamber 161. The sucked air may flow along the air flow path 30 shown in FIG. 4A. The sucked contaminants 20 may be filtered by the dust bag 154 and the filter 157 on the air flow path 30. When the control unit 155 receives the stop signal from the sensor 400, the control unit 155 stops the cleaning operation of the vacuum cleaner 150.

In some embodiments, the operating time of the vacuum cleaner 150 ranges from about 3 seconds to about 8 seconds. In some embodiments, the operating time of the vacuum cleaner 150 is about 5 seconds.

In some embodiments, as shown in FIG. 3B, after the cleaning operation is stopped, the transport mechanism 120 may transfer the vacuum cleaner 150 to another load port 210' so as to perform another cleaning operation. The system controller 140 may detect which load port is unoccupied by a wafer carrier 110. Therefore, the system controller 140 may control the transport mechanism 120 to transfer the vacuum cleaner 150 to the unoccupied load port 210'.

In some embodiments, the unoccupied load port 210' belongs to another semiconductor process tool 200'. In some other embodiments, the unoccupied load port 210' also belongs to the semiconductor process tool 200 (not shown). That is, the semiconductor process tool 200 may have both the load ports 210 and 210' (not shown).

In some embodiments, the transport mechanism 120 grasps the vacuum cleaner 150 during the whole operating time for transferring the vacuum cleaner 150 away from the load port 210 in a timely manner. The timely transfer of the vacuum cleaner 150 may reduce the occupied time of the load port 210, such that the wafer carrier 110 may be loaded on the cleaned load port 210 without being delayed.

Figure 6:
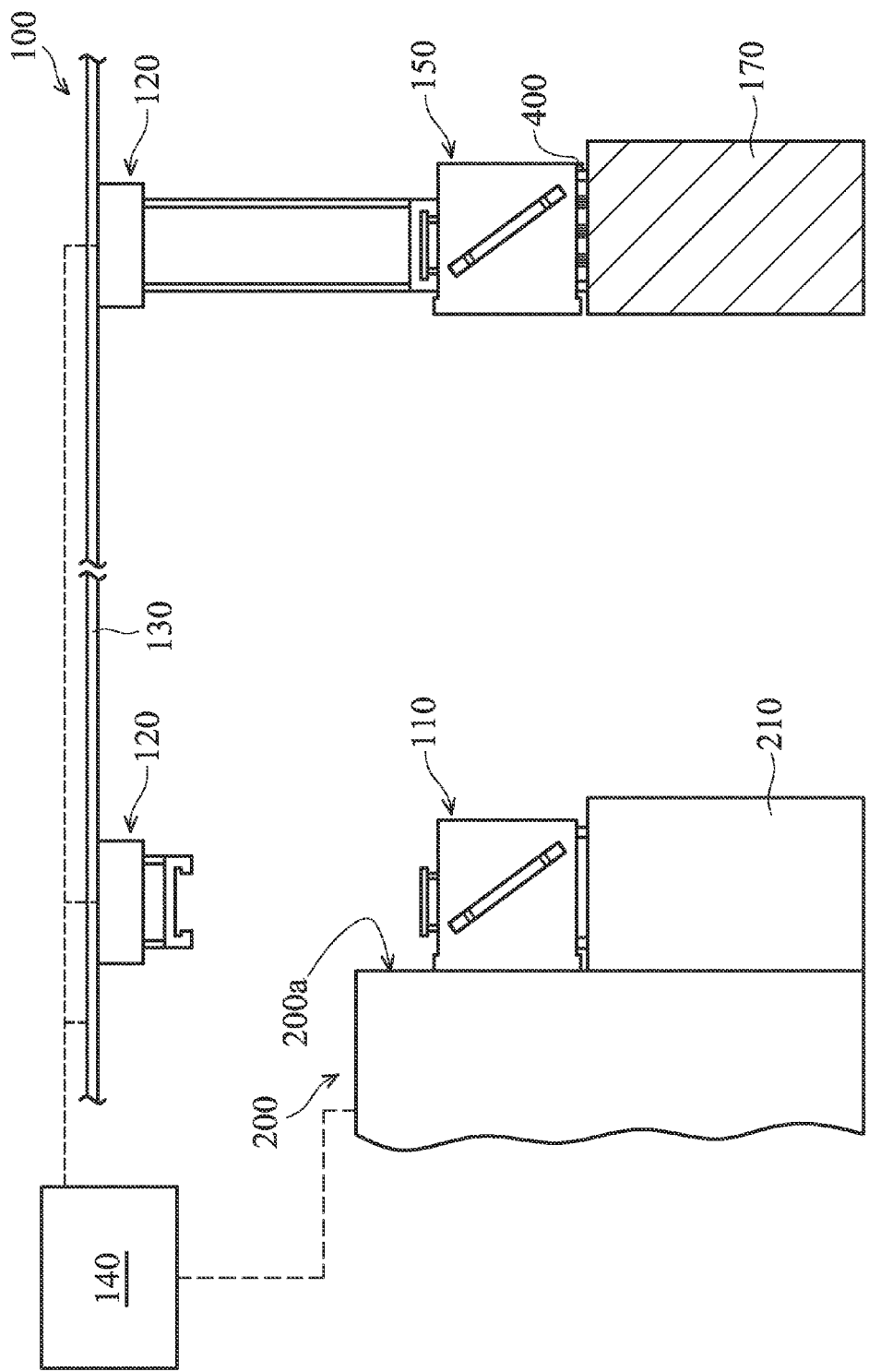
FIG. 6 is a side view of an automatic system and a semiconductor process tool, in accordance with some embodiments.

FIG. 6 is a side view of an automatic system 100 and a semiconductor process tool 200, in accordance with some embodiments. In some embodiments, as shown in FIG. 6, when the voltage level of the battery 156 (as shown in FIG. 4A) is low, the transport mechanism 120 transfers the vacuum cleaner 150 to a charge station 170 so as to charge the battery 156 of the vacuum cleaner 150.

In some embodiments, the automatic system 100 has many rails (not shown), and the vacuum cleaner 150 and the wafer carrier 110 are transferred along different rails.

As described above, the vacuum cleaner 150 has an external appearance similar to (or substantially the same as) that of a front opening unified pod. Therefore, the vacuum cleaner 150 is able to be automatically transferred by the transport mechanism 120. The vacuum cleaner 150 of the automatic system 100 may automatically, quickly, timely and frequently clean the load ports 210 of the semiconductor process tools 200. Therefore, the automatic system 100 with the vacuum cleaner 150 may clean the load ports more efficiently than manual cleaning. The system controller 140 may control (and record) the cleaning frequency of each of the semiconductor process tools 200 according to requirements. The cleanness of the load ports 210 is therefore properly maintained. As a result, the cleanness of the front chamber 240 is also properly maintained. Accordingly, yield is significantly increased. When the size of the wafers 10 increases, the size of the load ports 210 increases as well. The size of the vacuum cleaner 150 may accordingly increase to increase the cleaned area to match the enlarged load port 210.

Embodiments of mechanisms for cleaning load ports of one or more semiconductor process tools are provided. A vacuum cleaner automatically transferred by a transport mechanism is used to automatically clean load ports of semiconductor process tools. The vacuum cleaner is able to quickly and timely clean the load ports, and therefore the cleaning efficiency is significantly improved. Since the cleanness of the load ports and the front chambers is improved, yield is also greatly increased.

In accordance with some embodiments, an automatic system for cleaning load ports of semiconductor process tools is provided. The automatic system includes a vacuum cleaner, a rail, and a transport mechanism. The transport mechanism is moveably disposed on the rail and transfers the vacuum cleaner along the rail. The automatic system also includes a system controller. The system controller is connected to the semiconductor process tools and the transport mechanism to detect which load port is unoccupied, such that the system controller controls the transport mechanism to transfer the vacuum cleaner to the unoccupied load port to perform a cleaning process.

In accordance with some embodiments, a vacuum cleaner for cleaning load ports of semiconductor process tools is provided. The vacuum cleaner includes a cleaner carrier. The cleaner carrier has an external appearance similar to that of a front opening unified pod to facilitate being automatically transferred by a wafer carrier transport mechanism to the load ports. The cleaner carrier has an inner space, a number of suction openings, and a number of exhaust vents, wherein the suction openings penetrate through a bottom of the cleaner carrier, and the exhaust vents penetrate through the cleaner carrier. The vacuum cleaner also includes an inner apparatus for sucking, filtering out and collecting contaminants on the load ports. The inner apparatus is located in the inner space of the cleaner carrier.

In accordance with some embodiments, a method for cleaning load ports of semiconductor process tools is provided. The method includes transporting a vacuum cleaner by a wafer carrier transport mechanism to one of the load ports. The method also includes cleaning the load port by the vacuum cleaner. The method further includes transporting the vacuum cleaner away from the load port.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An automatic system for cleaning load ports of semiconductor process tools, comprising:
    a vacuum cleaner;
    a rail;
    a transport mechanism moveably disposed on the rail and configured to transfer the vacuum cleaner along the rail; and
    a system controller connected to the semiconductor process tools and the transport mechanism, wherein the system controller is configured to control the transport mechanism to transfer the vacuum cleaner to an unoccupied load port to perform a cleaning process, and the vacuum cleaner comprises:
    a cleaner carrier having a first chamber, a second chamber, one or more suction openings, and one or more exhaust vents, wherein the second chamber is above and connected with the first chamber, the suction openings penetrate through a bottom of the cleaner carrier, and the exhaust vents penetrate through a portion of the cleaner carrier to connect the second chamber to outside of the cleaner carrier;
    a suction fan disposed in the first chamber;
    a motor connected with the suction fan to provide a rotational force to the suction fan; and
    a dust bag detachably installed in the second chamber and on an air flow path to filter and collect contaminants sucked in by the suction fan.

2. The automatic system for cleaning the load ports of the semiconductor process tools as claimed in claim 1, further comprising:
    a plurality of wafer carriers, wherein the transport mechanism is configured to transfer the wafer carriers along the rail to or away from the load ports.

3. The automatic system for cleaning the load ports of the semiconductor process tools as claimed in claim 2, wherein the wafer carriers comprise front opening unified pods, and the vacuum cleaner has an external appearance substantially the same as that of the wafer carrier.

4. The automatic system for cleaning the load ports of the semiconductor process tools as claimed in claim 1, wherein the vacuum cleaner further comprises:
    a third chamber, wherein the third chamber is located between and isolated from the first chamber and the second chamber;
    a control unit disposed in the third chamber to control operations of the vacuum cleaner; and
    a battery disposed in the third chamber to supply power for operating the vacuum cleaner.

5. The automatic system for cleaning the load ports of the semiconductor process tools as claimed in claim 4, wherein the vacuum cleaner further comprises:
    a plurality of brushes rotatably mounted on a bottom of the cleaner carrier.

6. The automatic system for cleaning the load ports of the semiconductor process tools as claimed in claim 1, wherein the transport mechanism comprises an overhead hoist transfer system.

7. The automatic system for cleaning the load ports of the semiconductor process tools as claimed in claim 1, further comprising:
a charge station configured to charge a battery of the vacuum cleaner when the transport mechanism transfers the vacuum cleaner to the charge station.

8. The automatic system for cleaning the load ports of the semiconductor process tools as claimed in claim 1, wherein the system controller comprises a computer integrated manufacturing system.

9. A method for cleaning load ports of semiconductor process tools using the automatic system as claimed in claim 1, comprising:
transporting the vacuum cleaner by the transport mechanism to one of the load ports;
cleaning the load port by the vacuum cleaner; and
transporting the vacuum cleaner away from the load port.

10. The method for cleaning the load ports of the semiconductor process tools as claimed in claim 9, further comprising:
after transporting the vacuum cleaner away from the load port, transporting the vacuum cleaner to another one of the load ports to clean the another one load port.

11. The method for cleaning the load ports of the semiconductor process tools as claimed in claim 9, further comprising:
after transporting the vacuum cleaner away from the load port, transporting the vacuum cleaner to a stand-by position when the load ports of the process tools that need cleaning are occupied by wafer carriers respectively, wherein the vacuum cleaner stays in the stand-by position until one of the load ports that need cleaning becomes unoccupied.

12. The method for cleaning the load ports of the semiconductor process tools as claimed in claim 9, further comprising:
transporting the vacuum cleaner to a charge station so as to charge a battery of the vacuum cleaner.

13. The automatic system for cleaning the load ports of the semiconductor process tools as claimed in claim 1, wherein the cleaner carrier has an external appearance the same as that of a front opening unified pod.

14. The automatic system for cleaning the load ports of the semiconductor process tools as claimed in claim 13, wherein the suction fan is disposed above the suction openings, and the vacuum cleaner further comprises:
a control unit configured to control operations of the vacuum cleaner; and
a battery configured to supply power for operating the vacuum cleaner.

15. The automatic system for cleaning the load ports of the semiconductor process tools as claimed in claim 14, wherein the dust bag has a plurality of pores each having a diameter less than or equal to 0.3 µm.

16. The automatic system for cleaning the load ports of the semiconductor process tools as claimed in claim 14, wherein the exhaust vents penetrate through a rear portion of the cleaner carrier, and the vacuum cleaner further comprises:
a filter disposed between the dust bag and the rear portion of the cleaner carrier to cover the exhaust vents and filter out and collect contaminants sucked by the suction fan, wherein the filter has a plurality of pores each having a diameter less than or equal to 0.2 µm.

17. The automatic system for cleaning the load ports of the semiconductor process tools as claimed in claim 14, wherein the battery is a rechargeable battery.

18. The automatic system for cleaning the load ports of the semiconductor process tools as claimed in claim 13, further comprising:
a plurality of brushes rotatably mounted on the bottom of the cleaner carrier.

19. The automatic system for cleaning the load ports of the semiconductor process tools as claimed in claim 13, wherein the cleaner carrier comprises a cleaner housing and a cleaner robotic flange, the cleaner housing is a box-type housing with an open front side and a door detachably installed at the open front side, and the cleaner robotic flange is installed on a top surface or the cleaner housing and is capable of being grasped by the transport mechanism.

20. An automatic system for cleaning load ports of semiconductor process tools, comprising: a vacuum cleaner; a rail; a transport mechanism moveably disposed on the rail and configured to transfer the vacuum cleaner along the rail; and a system controller connected to the semiconductor process tools and the transport mechanism, wherein the system controller is configured to control the transport mechanism to transfer the vacuum cleaner to an unoccupied load port to perform a cleaning process, wherein the vacuum cleaner comprises: a cleaner carrier having an external appearance similar to that of a front opening unified pod, wherein the cleaner carrier has an inner space, one or more suction openings, one or more exhaust vents, the suction openings penetrate through a bottom of the cleaner carrier, the exhaust vents penetrate through the cleaner carrier; the cleaner carrier comprises a cleaner housing and a cleaner robotic flange, the cleaner housing is a box-type housing with an open front side and a door detachably installed at the open front side, and the cleaner robotic flange is installed on a top surface of the cleaner housing and is capable of being grasped by the transport mechanism; and wherein an inner apparatus is located in the inner space of the cleaner carrier.

* * * * *